United States Patent
Bouzidi

(10) Patent No.: US 7,054,439 B2
(45) Date of Patent: May 30, 2006

(54) DIFFERENTIAL INPUT STAGE FOR ELECTRONIC EQUIPMENT, COMPRISING MEANS FOR REDUCING INTERFERENCE CAUSED BY A VOLTAGE OR CURRENT IN COMMON MODE

(75) Inventor: Jean-Pierre Bouzidi, Lannion (FR)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 10/502,354

(22) PCT Filed: Jan. 14, 2003

(86) PCT No.: PCT/FR03/00092

§ 371 (c)(1),
(2), (4) Date: Jul. 23, 2004

(87) PCT Pub. No.: WO03/063343

PCT Pub. Date: Jul. 31, 2003

(65) Prior Publication Data

US 2005/0063537 A1    Mar. 24, 2005

(30) Foreign Application Priority Data

Jan. 24, 2002    (FR) .................. 02 00858

(51) Int. Cl.
H03F 3/45    (2006.01)
H04M 19/00    (2006.01)

(52) U.S. Cl. ................ 379/413; 379/405; 330/258

(58) Field of Classification Search ................ 379/405, 379/416
See application file for complete search history.

(56) References Cited

U.S. PATENT DOCUMENTS 3,516,005 A * 6/1970 Brown, Jr. .................. 330/258
3,761,831 A * 9/1973 Foerster ...................... 330/258
4,612,417 A    9/1986 Toumani
5,329,585 A * 7/1994 Susak et al. ................ 379/413

FOREIGN PATENT DOCUMENTS

EP    0 396 351 A    11/1990

* cited by examiner

*Primary Examiner*—Daniel Swerdlow
(74) *Attorney, Agent, or Firm*—Sughrue Mion, PLLC

(57) ABSTRACT

According to the invention, means for reducing the interference caused by a voltage or a current in common mode, comprise adders (S3; S4) in each path for adding a first counter-reaction voltage (V1) to the voltage of the relevant path, a bridge (R1, R2) and an inverter (I3) for provision of said first counter-reaction voltage which is equal to half the sum of the voltages (VA, VB), respectively supplied to the inputs (A; B), with an opposing sign. According to the invention, the effect of a delay introduced by the inverter (I3) may be reduced, whereby said stage further comprises means (S5; S6) for adding in addition to the input voltage for each path, a second counter-reaction voltage (Va1; Vb1), and means (R1, R2, I1, S1; I2, S2) for provision of a second counter-reaction voltage (Va1; Vb1) which is a function of the input voltage (VA; VB) at the input corresponding to said path, with an opposing sign and with a delay identical to that generated by the inverter (I3).

3 Claims, 3 Drawing Sheets

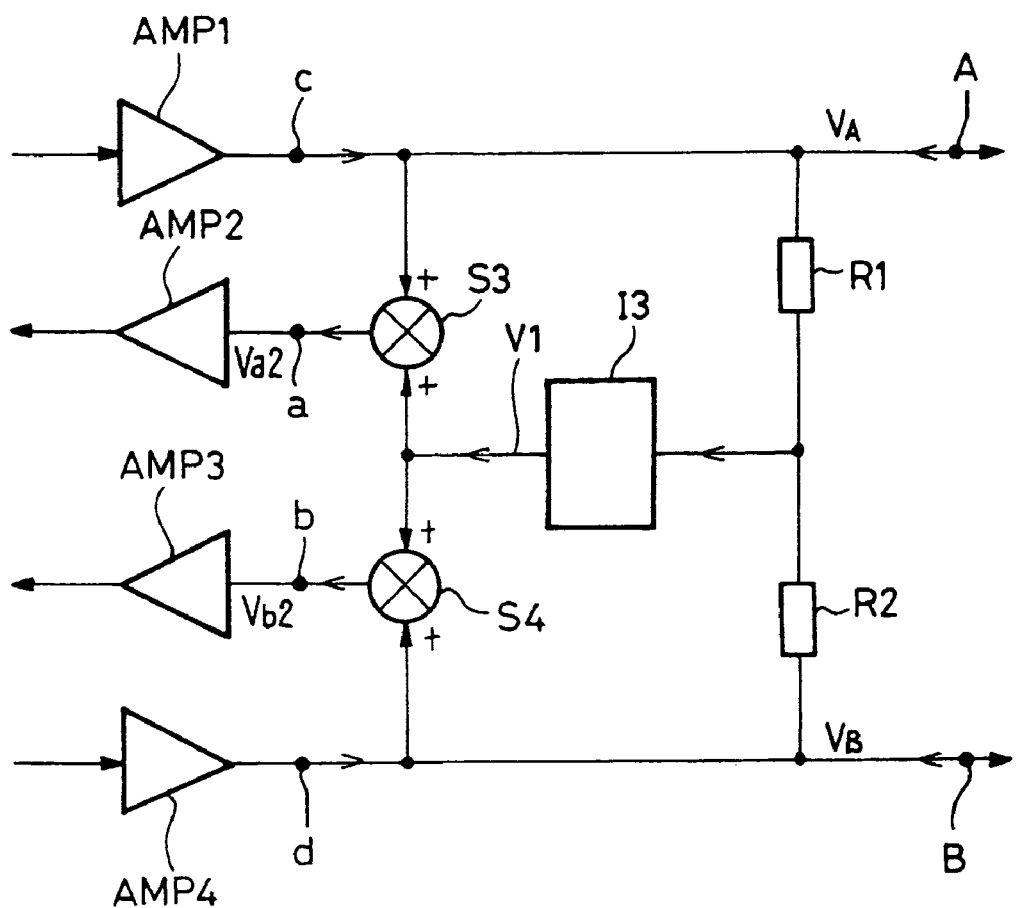
FIG_1 PRIOR ART

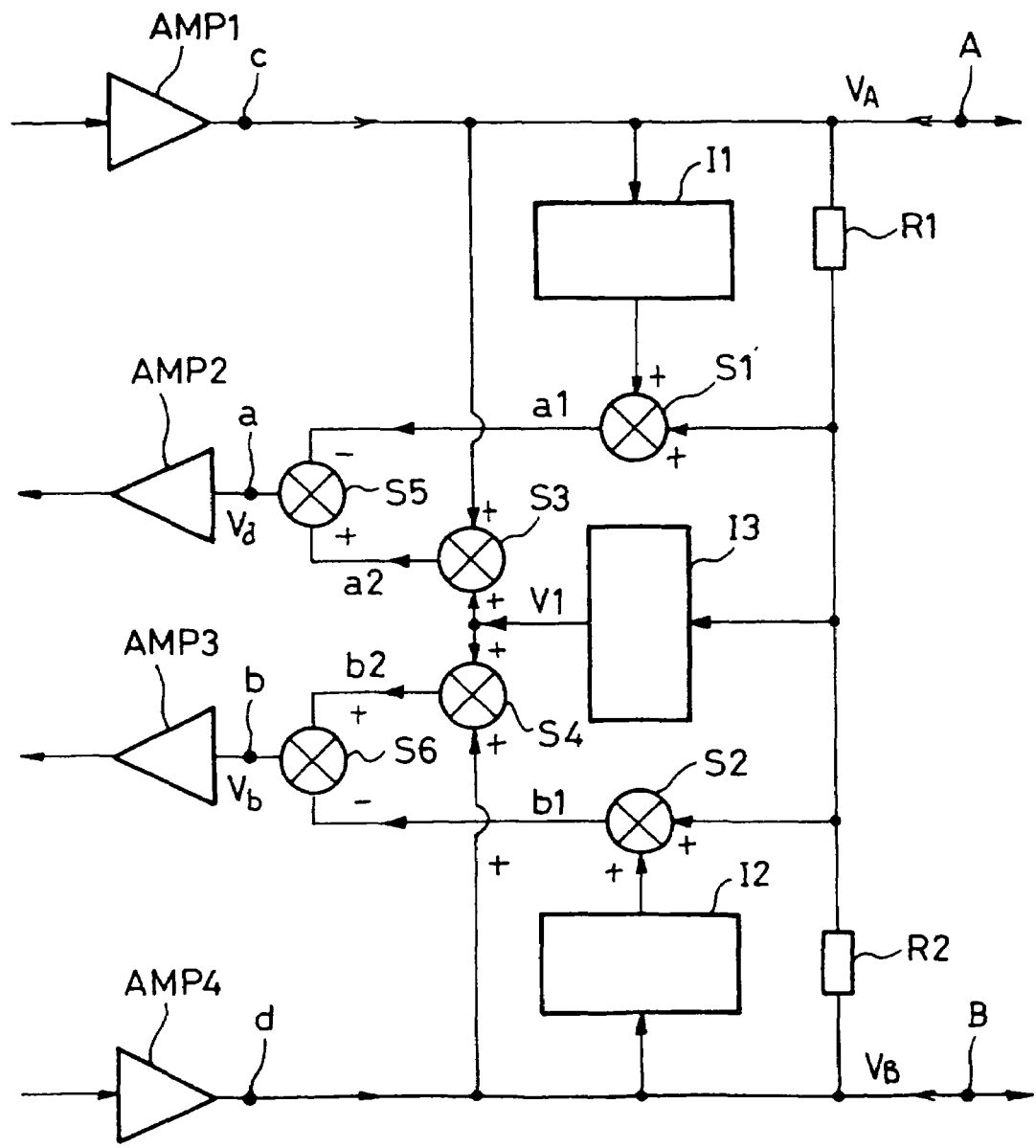

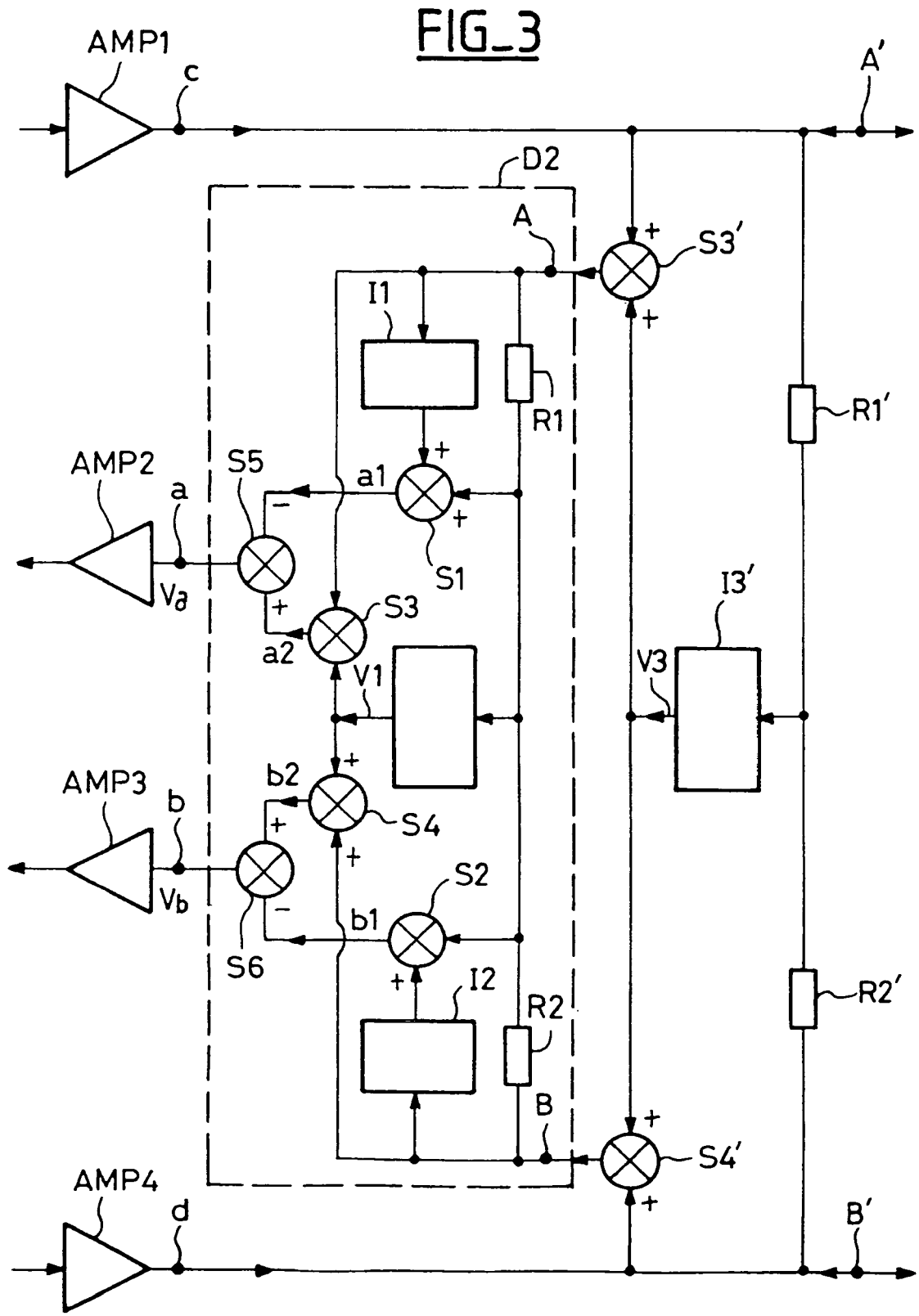
FIG_3

DIFFERENTIAL INPUT STAGE FOR ELECTRONIC EQUIPMENT, COMPRISING MEANS FOR REDUCING INTERFERENCE CAUSED BY A VOLTAGE OR CURRENT IN COMMON MODE

The invention relates to a differential input stage of electronic equipment comprising means for reducing the interference caused by a voltage or a current applied in common mode to two inputs of the stage. It relates in particular to subscriber cards used in telephone exchanges and subscriber terminals. A subscriber card is connected to the terminal of a subscriber by a line comprising at least two conductors used to transmit voice or data signals in both directions and a DC voltage providing a remote power feed to the terminal. These signals are transmitted in differential mode, i.e. in the form of a voltage difference between the two conductors.

The electronic circuits of a subscriber card or a subscriber terminal are subject to interference caused by unwanted signals applied in common mode. This common mode interference takes the form of voltages and currents of equal value on the two conductors of the subscriber line. These voltages and currents have multiple causes. The proximity of medium-voltage or high-voltage power lines and switching on the overhead power cables of electric trains when a train passes may be cited. More generally, any electrical equipment that induces an electrical current in the subscriber lines creates common mode voltages and currents in the line.

If a subscriber card or terminal is sensitive to common mode voltages and currents, interference is added to the wanted differential signal and may therefore degrade the transmission of the wanted signal. The problem is particularly serious in the case of digital telephone connections because the interference may seriously degrade or even interrupt the call. To guard against such interference, protection means are provided at the exchange, on the subscriber cards, and at the subscriber end, in the terminals.

To reduce such interference, it is conventional to use a transformer and an inductor on a subscriber card. The inductor significantly attenuates the transmission of interference caused by common mode voltages and currents to the remote power feed generator. The transformer blocks the DC component of the remote power feed current and significantly attenuates the transmission of interference caused by common mode voltages and currents to the electronic circuits that process the voice and data signals. Thanks to the transformer, the attenuation of common mode interference easily reaches 60 dB. A device of this kind has the bulk and weight drawbacks associated with the use of magnetic circuits, ruling out any prospect of integrating the components.

U.S. Pat. No. 4,612,417 describes a differential output stage for a subscriber card adapted to be used in a telephone exchange, where it is connected to a subscriber line. This differential output stage comprises means for reducing interference caused by a voltage or current applied in common mode to the subscriber line. It comprises two channels each connecting one input of this stage to one output of this stage. To reduce interference, it comprises on each channel means for adding to the input voltage of the channel concerned a feedback voltage and means for providing this feedback voltage, which is equal to half the sum of the voltages present at the respective outputs, with the opposite sign. The interference is completely neutralized if the feedback voltage is exactly equal and opposite to half the sum of the voltages present at the respective outputs. In practice, the inverter used to invert the sign of this voltage caused some phase delay, which compromises the effectiveness of the feedback.

The object of the invention is to propose a highly effective differential input stage for reducing common mode interference without using transformers or inductors.

The invention consists in a differential input stage of electronic equipment, comprising means for reducing the interference caused by a voltage or current applied in common mode to two inputs of this stage; this stage comprising two channels each connecting one input to one output; each channel comprising first means for reducing interference, these first means comprising means for adding to the input voltage of the channel concerned a first feedback voltage, and means for supplying a first feedback voltage that is equal to half the sum of the voltages present at the inputs, respectively, with the opposite sign;

characterized in that, to reduce the effect of a delay introduced by the components of the means for supplying the first feedback voltage, this stage further comprises means for further adding to the input voltage of each channel a second feedback voltage and means for supplying a second feedback voltage that is a function of the voltage at the input corresponding to this channel, with the opposite sign, and with a delay identical to that caused by the components of the means for supplying the first feedback voltage.

This stage very effectively reduces common mode interference on each channel because the second feedback voltage compensates the effect of the delay caused by the components of the means for supplying a first feedback voltage.

Another embodiment of the differential stage of the invention further comprises, on the upstream side of the first means for reducing interference, second means for reducing common mode interference, comprising, on each of the channels, means for adding to the input voltage of the channel concerned a third feedback voltage, and means for supplying a third feedback voltage that is equal to k times half the sum of the voltages present at the inputs, respectively, of the differential stage, with the opposite sign; k being a positive integer less than or equal to 1.

This embodiment reduces electrical power consumption compared to the previous embodiment because:
- the second means for reducing interference reduce the common mode voltage applied to the first reduction means (on their downstream side), so that the first means may receive a supply voltage that is much lower than in the second embodiment; and
- the second means for reducing interference do not themselves lead to any significant increase in consumption because the means for adding said feedback voltage comprise:
  two adders that may comprise only passive components, and
  a single inverter consuming, for the same supply voltage, less power than the means for providing the second feedback voltage in the second embodiment (typically comprising three inverters).

The consumption of this single inverter may be reduced if k is made significantly less than 1.

The invention will be better understood and other features will become apparent with the aid of the following description and the accompanying drawings:

FIG. 1 represents the circuit of one embodiment of a differential input stage comprising means analogous to those described in U.S. Pat. No. 4,612,417 for reducing interference caused by a voltage or current applied in common mode to the subscriber line.

FIG. 2 represents the circuit of a first embodiment of the differential stage according to the invention offering better reduction of common mode interference.

FIG. 3 represents the circuit of a second embodiment of the differential stage according to the invention having a much lower electrical power consumption than the embodiment represented in FIG. 2.

The embodiment represented in FIG. 1 is intended to be used as a subscriber card input-output stage. It comprises:

two terminals A and B adapted to be connected to a subscriber line;

two output terminals a and b connected to the inputs of respective amplifiers AMP2 and AMP3 on the subscriber card;

two input terminals c and d connected to the outputs of respective amplifiers AMP1 and AMP4 on the subscriber card and connected to the input-output terminals A and B, respectively;

a bridge comprising two resistors R1 and R2 of equal resistance between the terminals A and B;

an inverter I3 having an input connected to the mid-point of the bridge R1R2;

an adder S3 having an input connected to the terminals c and A, an input connected to the output of the inverter I3, and an output connected to the output terminal a; and an adder S4 having an input connected to the terminals d and B, an input connected to the output of the inverter I3, and an output connected to the output terminal b.

Two voltages VA and VB are present at the input-output terminals A and B, respectively:

$$VA=VdA+Vmc$$

$$VB=VdB+Vmc$$

where:

$$VdA=-VdB$$

VdA is the voltage of the differential signal at the terminal A,

VdB is the voltage of the differential signal at the terminal B, and

Vmc is the common mode voltage at the terminals A and B.

The mid-point of the bridge R1R2 supplies a voltage (VA+VB)/2 equal to the voltage Vmc applied in common mode to the subscriber line. If the inverter I3 is a perfect inverter, with no delay between the input signal and the output signal, its transfer function is simply −1. The output of the inverter I3 supplies a feedback voltage V1=−(VA+VB)/2=−Vmc.

The adder S3 adds V1 to the input voltage VA to cancel the common mode voltage Vmc. It therefore provides at the output terminal a d voltage:

$$VA=VdA$$

Similarly, the output of the adder S3 supplies at the output terminal b a voltage:

$$Vb=VdB$$

The voltage VA of the differential signal supplied to the amplifier AMP2 is independent of the common mode voltage Vmc if the components R1, R2, I3 are perfect. The interference consisting of this common mode voltage is therefore eliminated. Likewise, the voltage Vb supplied to the amplifier AMP3. This differential stage therefore cancels interference caused by the common mode voltage Vmc.

In reality, an inverter is never perfect and causes a phase delay in the inverted signal. This delay reduces the effectiveness of the cancellation of interference caused by the common mode voltage. Consider a non-null delay: the transfer function of the inverter I3 in the frequency domain becomes $-e^{-i\phi}$ where $-e^{-i\phi}$ represents the phase delay introduced by the inverter.

In the frequency domain, the equations representing the voltages at the terminals A, B, a, b become:

$$VA=VdA+Vmc$$

$$VB=VdB+Vmc$$

$$V1=Vmc.(1-e^{-1\phi})$$

$$Va=VdA+V1=VdA+Vmc.(1-e^{-i\phi})$$

$$Vb=VdB+V1=VdB+Vmc.(1-e^{-i\phi})$$

These equations show that the voltages VA and VB depend on the common mode voltage Vmc. Thus cancellation of the interference is incomplete.

FIG. 2 represents the circuit of a first embodiment achieving better reduction of common mode interference when the inverter I3 is not perfect. This second example includes means identical to the means constituting the preceding embodiment, except that the outputs of the adders S3 and S4 are no longer connected directly to the terminals a and b, respectively. It therefore comprises:

two terminals A and B adapted to be connected to a subscriber line;

two output terminals a and b connected to the inputs of respective amplifiers AMP2 and AMP3 of the subscriber circuits;

two input terminals c and d connected to the outputs of respective amplifiers AMP1 and AMP4 and connected to the input-output terminals A and B, respectively;

a bridge of two resistors R1 and R2 of equal resistance between the terminals A and B;

an inverter I3 having an input connected to the mid-point of the bridge R1R2;

an adder S3 having an input connected to the terminals c and A, an input connected to the output of the inverter I3, and an output a2; and an adder S4 having an input connected to the terminals d and B, an input connected to the output of the inverter I3, and an output b2.

It further comprises the following means:

an inverter I1 having an input connected to the terminals A and c, and an output;

an inverter I2 having an input connected to the terminals B and d, and an output;

an adder S1 having two inputs connected to the mid-point of the bridge R1R2 and to the output of the inverter I1, respectively, and an output a1;

an adder S2 having two inputs connected to the mid-point of the bridge R1R2 and to the output of the inverter I2, respectively, and an output a2;

an adder S5 having an inverting input connected to the output a1 of the adder S1, a non-inverting input connected to the output a2 of the adder S3, and an output connected to the output terminal a; and an adder S6 having an inverting input connected to the output b1 of the adder S2, a non-inverting input connected to the output b2 of the adder S4, and an output connected to the output terminal b.

The inverters I1, I2, I3 have the respective transfer functions:

$$-e^{-i\phi_1}, -e^{-i\phi_2}, -e^{-i\phi_3}$$

The improvement to the device consists in further adding to the input voltage of each channel a second feedback voltage that neutralizes residual interference, which voltage is equal to $Vmc.(1-e^{-i\phi})$. This second feedback voltage is obtained in particular by inverting the input voltage corresponding to this channel using a second inverter causing a delay identical to that caused by the first inverter I3.

The voltages at the input-output terminals A and B are:

$$VA=VdA+Vmc$$

$$VB=VdB+Vmc$$

$$V1=-Vmc.e^{-i\phi_3}$$

The voltage at the output a1 of the adder S1 is:

$$Va1=-e^{-i\phi_1}.(VdA+Vmc)+(VA+VB)/2=-VdA.e^{-i\phi_1}+Vmc.(1-e^{i\phi_1})$$

The voltage at the output b1 of the adder S2 is:

$$Vb1=-e^{-i\phi_2}.(VdB+Vmc)+(VA+VB)/2=-VdB.e^{-i\phi_2}+Vmc.(1+e^{i\phi_2})$$

The voltage at the output a2 of the adder S3 is:

$$Va2=VdA+Vmc-Vmc.e^{-i\phi_3}=VdA+Vmc.(1-e^{-i\phi_3})$$

The voltage at the output b2 of the adder S4 is:

$$Vb2=VdB+Vmc-Vmc.e^{-i\phi_3}VdB+Vmc.(1-e^{-i\phi_3})$$

The voltage at the output a of the adder S5 is:

$$Va=Va2-Va1=VdA.(1+e^{-i\phi_1})+Vmc.(e^{-i\phi_1}-e^{-i\phi_3})$$

The voltage at the output b of the adder S6 is:

$$Vb=Vb2-Vb1=VdB.(1+e^{-i\phi_2})+Vmc.(e^{-i\phi_2}-e^{-i\phi_3})$$

As the inverters I1, I2, I3 have the same electric circuit, it is possible to consider, to a first approximation, that their transfer functions are all equal to $-e^{-i\phi}$. Then:

$$Va \approx VdA.(1+e^{-i\phi}) \approx 2\ VdA$$

$$Vb \approx VdB.(1+e^{-i\phi}) \approx 2\ Vd$$

Note that the voltage Va and the voltage Vb are independent of the value of the common mode voltage Vmc, even though the delays of the inverters are non-null. Interference caused by the common mode voltage Vmc is therefore eliminated. The same applies to a common mode current. Common mode voltage and current attenuations of 50 dB have been achieved with this second embodiment.

FIG. 3 represents the circuit of a second embodiment of the differential stage according to the invention offering better reduction of interference than the embodiment represented in FIG. 1, and much lower electrical power consumption than the embodiment represented in FIG. 2. It includes in particular a circuit D2 identical to the embodiment represented in FIG. 2 except that the terminals A and B are no longer the input-output terminals of the differential stage. The input-output terminals are the terminals A' and B' respectively connected to the input terminals c and d of the differential stage and to an additional interference reduction device. This additional device is on the upstream side of the circuit D2 and has a structure analogous to that of the differential stage represented in FIG. 1, to bring about a first reduction of the common mode voltage. This additional device comprises:

two terminals A' and B' adapted to be connected to a subscriber line;
two output terminals respectively connected to the inputs A and B of the circuit D2;
two input terminals c and d respectively connected to the outputs of two amplifiers AMP1 and AMP4 on the subscriber card and respectively connected to the input-output terminals A' and B';
a bridge comprising two resistors R1' and R2' of equal resistance between the terminals A' and B';
an inverter I3' having an input connected to the mid-point of the bridge R1'R2';
an adder S3' having an input connected to the terminals c and A', an input connected to the output of the inverter I3', and an output connected to the terminal A;
an adder S4' having an input connected to the terminals d and B', an input connected to the output of the inverter I3', and an output connected to the terminal B.

Two voltages VA' and VB' are present at the input-output terminals A' and B', respectively:

$$VA'=VdA'+Vmc$$

$$VB'=VdB'+Vmc$$

Where:

$$VdA'=-VdB'$$

VdA' is the voltage of the differential signal at the terminal A',
VdB' is the voltage of the differential signal at the terminal B', and
Vmc is the common mode voltage at the terminals A' and B'.

The mid-point of the bridge R1'R2' provides a voltage (VA'+VB')/2 equal to the voltage Vmc applied in common mode to the subscriber line. If the inverter I3' is a perfect inverter, with no time-delay between the input signal and the output signal, its transfer function is simply $-1$. The output of the switch I3' supplies a feedback voltage $V3=-(VA'+VB')/2=-Vmc$.

The adder S3' adds V3 to the input voltage VA' to cancel the common mode voltage Vmc. It therefore supplies at the terminal A a voltage:

$$VA=VdA'$$

Similarly, the output of the adder S4' then supplies at the terminal B a voltage:

$$VB=VdB'$$

The voltage VA of the differential signal supplied to the circuit D2 is independent of the common mode voltage Vmc, to the degree that the components R1', R2', I3' are perfect. The interference constituted by this common mode voltage is therefore eliminated (or at least reduced). The same applies to the voltage VB. This additional device therefore provides a first reduction of interference caused by the common mode voltage Vmc; however, it additionally enables the circuit D2 to be designed so that it consumes less electrical power.

This is because, since the common mode voltage at the terminals A and B has been eliminated (or at least greatly reduced), the voltages applied to the inputs of the inverters I1, I2, I3 are reduced. It is then possible to power them at a lower voltage, without risk of saturation. However, the inverter I3' must be able to operate with a high common mode voltage. It therefore requires a high supply voltage. Overall there is a saving in energy since the inverter I3' is the only one that has to be supplied at a high voltage, whereas, in the embodiment represented in FIG. 2, three inverters I1, I2, I3 must be supplied at a high voltage.

This second embodiment may be modified to reduce the consumption of the inverter I3'. This modification consists in using an inverter I3' having a gain k greater than 0 and less than 1. Then:

$$VA=VdA+Vmc.(1-k)$$

$$VB=VdB+Vmc.(1-k)$$

Neutralization of the common mode voltage Vmc by this inverter I3' is therefore not complete, but will be completed in the next stage comprising the inverters I1, I2, I3. On the other hand, the inverter I3' then requires a lower supply voltage, which reduces the electrical power consumption of the inverter I3' . The value of k is chosen taking account of the amplitude conditions of the common mode voltages and currents and the required global power consumption.

The invention claimed is:

1. Differential input stage (1) of electronic equipment, comprising means for reducing the interference caused by a voltage or current applied in common mode to two inputs (A; B) of this stage; this stage comprising two channels each connecting one input (A; B) to one output (a; b); each channel comprising first means for reducing interference, these first means comprising, on each of the channels, means (S3; S4) for adding to the input voltage of the channel concerned a first feedback voltage (V1), and means (R1, R2, I3) for supplying a first feedback voltage that is equal to half the sum of the voltages (VA; VB) present at the inputs (A; B), respectively, with the opposite sign; characterized in that, to reduce the effect of a delay, introduced by the components of the means (R1, R2, I3) for supplying the first feedback voltage (V1), this stage further comprises means (S5; S6) for further adding to the input voltage of each channel a second feedback voltage (Va1; Vb1) and means (R1, R2; I1, S1; I2, S2) for supplying a second feedback voltage (Va1; Vb1) that is a function of the voltage (VA; VB) at the input corresponding to this channel, with the opposite sign, and with a delay identical to that caused by the components of the means (R1, R2, I3) for supplying the first feedback voltage (V1).

2. Stage according to claim 1, characterized in that it further comprises, on the upstream side of the first means for reducing interference, second means for reducing common mode interference, comprising, on each of the channels, means (S3'; S4') for adding to the input voltage of the channel concerned a third feedback voltage (V3), and means (R1', R2', I3') for supplying a third feedback voltage that is equal to k times half the sum of the voltages (VA'; VB') present at the inputs (A'; B'), respectively, of the differential stage, with the opposite sign; k being a positive integer less than or equal to 1.

3. Stage according to claim 2, characterized in that the means (R1', R2', I3') for supplying a third feedback voltage (V3) comprise a bridge of two resistors (R1', R2'), connected to the inputs (A', B') of the differential stage, and an inverter (I3' ) having an input connected to the mid-point of the bridge and having an output supplying the third feedback voltage (V3).

* * * * *